United States Patent [19]

Yeh

[11] 4,308,549
[45] Dec. 29, 1981

[54] HIGH VOLTAGE FIELD EFFECT TRANSISTOR

[75] Inventor: Keming W. Yeh, Los Angeles, Calif.

[73] Assignee: Xerox Corporation, Stamford, Conn.

[21] Appl. No.: 970,679

[22] Filed: Dec. 18, 1978

[51] Int. Cl.³ .................... H01L 29/78; H01L 29/40
[52] U.S. Cl. ........................................ 357/23; 357/53
[58] Field of Search .................................. 357/23, 53

[56] References Cited

U.S. PATENT DOCUMENTS

| | | | |
|---|---|---|---|
| 3,845,495 | 10/1974 | Cauge et al. | 357/23 |
| 3,996,655 | 12/1976 | Cunningham et al. | 357/23 |
| 4,058,822 | 11/1977 | Awane et al. | 357/23 |
| 4,115,709 | 9/1978 | Inoue et al. | 357/23 |

Primary Examiner—Gene M. Munson
Attorney, Agent, or Firm—Robert E. Cunha

[57] ABSTRACT

A circular high voltage field effect transistor suitable for inclusion in LSI circuits, and the process for making said transistor, are described. The transistor comprises a central drain and concentric circular field plate, gate and source. Alternate embodiments include an intermediate gate and resistive gate. Implantation and diffusion techniques are described for producing the source and channel regions, and various device dimensions may be varied to improve either current or voltage handling capability or speed capability.

3 Claims, 11 Drawing Figures

$L = L_1 + L_2$

HIGH VOLTAGE FIELD EFFECT TRANSISTOR

BACKGROUND OF THE INVENTION

This invention is a high voltage field effect transistor (HIFET), and the process for making said HIFET. Its radial configuration occupies little space on a substrate and minimizes cross conduction between devices, and is, therefore, suitable for inclusion in LSI designs requiring high voltage outputs.

It is frequently required, in industrial applications of large scale integrated circuits, to switch high voltages. Since LSI devices commonly work with supply voltages in the area of from four to fifteen volts, special circuits must be provided to handle voltages in the 200 to 1,000 volt range. An example of this use would be an electrostatic printer. In this case, large amounts of low voltage random circuitry are required to decode signals arriving from an outside source, and a voltage of at least 200 volts must be applied to the electrostatic printing mechanism.

The common method of fabricating this kind of circuit would be to use an LSI chip for the low voltage logic functions and to supply a separate high voltage amplifier for each output channel. To use a common numerical example, if there were sixteen output lines to be driven, the LSI chip output would be connected to sixteen discrete voltage amplifiers, each of which would drive an output channel.

If these high voltage amplifiers could be included within the LSI chip a large reduction in cost could be achieved, because the one consolidated unit would be far less costly than the original seventeen units, and because of the reduced amount of space and wiring required. Also, the reliability of the resultant circuit would be far greater than the reliability of the original circuit.

However, the inclusion of these high voltage amplifiers on an LSI chip has been impractical because of the large substrate area that each amplifier requires and because of the inherent tendency of high voltage devices to interact with each other and with other circuits on the same chip. To produce a commercial chip which includes a large number of high voltage output circuits would therefore require a circuit configuration which would allow the dense packing of high voltage amplifiers into an LSI chip but which would not allow these amplifiers to interact with each other or with the remainder of the circuitry on the chip.

SUMMARY OF THE INVENTION

A commercial LSI chip containing a set of integrated high voltage amplifiers is made possible by the geometry of these amplifiers, said geometry resulting in a small substrate area required for each device, reliable high voltage handling capability, and the minimization of cross conduction between devices to allow high density packing on the chip.

The minimization of cross conduction between devices is made possible by the circular construction of each device wherein the drain roughly corresponds to the central portion of the device, the gate is arranged circularly around the drain and the source is arranged circularly around the gate. Considering that the drain is used to switch the high voltages, and the source is typically kept at ground potential, it can be seen that a circular structure with the source arranged at the circumference of the circle allows dense packing since the source of each device shields the high voltage transients produced at each drain from the adjacent circuits.

This device can switch drain voltages of from 200 to 1,000 volts in spite of the small dimensions of the device because of its particular geometrical configuration which includes a field plate and a resistive gate or intermediate gate for preventing high electrical field strength to exist at any point in the channel and particularly at any point in the channel near the drain. Furthermore, a differential thickness of thermal oxide is provided wherein the field plate is separated from the channel by a thick layer of oxide to prevent voltage breakdown at high field plate voltages while a thin oxide layer is provided between the channel and the gate to allow the gate to have good control over the current flow.

A further advantage of this circular configuration is that the drain and field plate may be continuously connected by a metal deposition, the resulting large central circular metalized area being used as a bonding pad. In this way, a separate high voltage metalized conducting line need not be included in the design of the chip to connect each drain to a typical bonding pad. This is a large advantage in that the provision of a conducting line carrying switched high voltages across some of the circuitry to a typical bonding pad would be a source of electrical breakdown problems and result in reduced yield and reliability.

DETAILED DESCRIPTION OF THE INVENTION

Figure 1A:
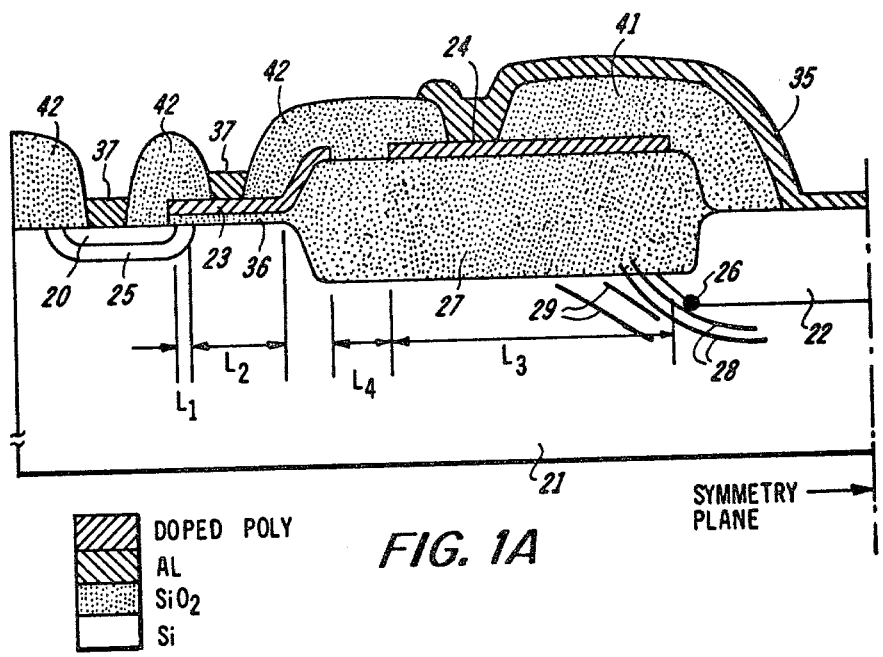
FIG. 1A is a cut-away side view of the basic configuration of the device and comprises diffused source and channel P regions.
Figure 1B:
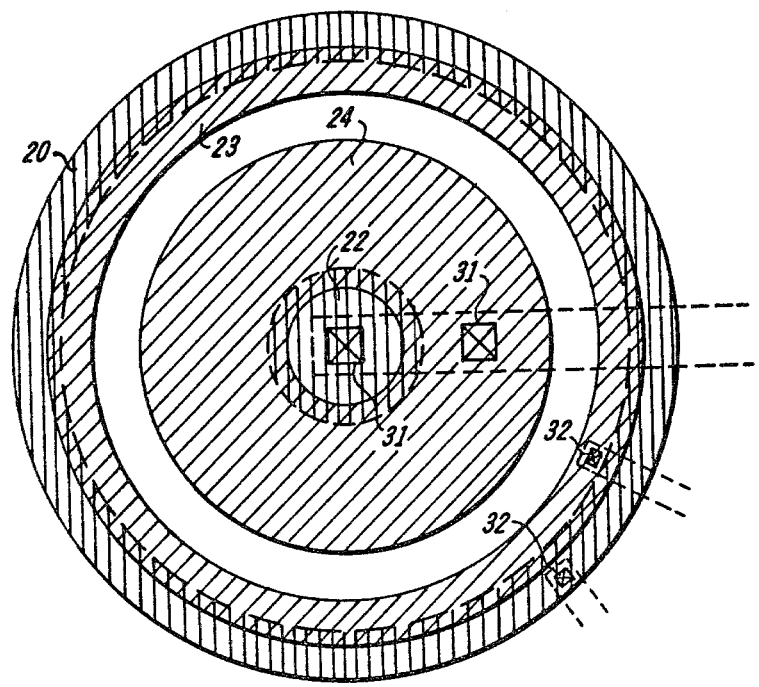
FIG. 1B is a top view of the device of FIG. 1A.

The properties of this particular high voltage field effect transistor, which comprise high voltage switching capability, small area per circuit and high packing density are made possible by the geometry of the device as shown in FIGS. 1A and 1B. These figures represent one embodiment of the device. As shown on the left hand side of FIG. 1A and on the perimeter of FIG. 1B, an n+ source region 20 is provided on a lightly doped P substrate 21. At the right side of FIG. 1A and at the center of FIG. 1B an n+ drain region 22 is also provided on the substrate 21. The n+ source and drain regions are connected by the P— channel substrate material thereby creating an enhancement mode field effect transistor.

The channel between source 20 and drain 22 in this configuration can be described in terms of its various portions. Gate 23 controls the conductivity of the channel comprising portions L1 and L2 while the field plate 24 controls the electrical field strength of drift regions L3 and L4. Since the gate 23 controls current flow, it is accurate to consider L1 and L2 as the actual channel and L3 and L4 as a drift region where majority carriers merely drift in the applied electric field toward the drain L22.

More particularly, the source 20 is immediately surrounded by a diffused P region 25. It can be seen that as a positive voltage is applied to the gate 23, between 5 and 12 volts in this example, the P region 25 will begin to conduct after the remainder of the channel has begun to conduct since the P region 25 is more heavily doped than the P— substrate 21. Therefore, the portion of the short channel length labeled L1 actually controls the FET current and can be characterized as the effective channel length which enables the high gain and high current capability of the device.

The failure mode of a high voltage field effect transistor typically is a voltage breakdown of the transistor between the substrate which is held at zero volts and the drain which, in this case, is switching voltages of approximately 200 to 1,000 volts. This typically occurs at a point where the voltage gradient, or electrical field strength, is highest, and it has been found that the highest concentration of voltage stress is usually produced in the drift region at and around point 26, the sharp corner of the junction between the drain 22 and the L3 portion of the channel. At this point the lines of equal potential which run more or less horizontally under the drain bend upward into the thermal oxide layer 27 and crowd around point 26 to form a concentration of electrical field strength in this area. In the absence of a field plate 24 these lines of equal potential would appear as shown in the diagram as lines 28.

To prevent this concentration of electrical field strength, a field plate 24 is added to the FET and is electrically coupled to the drain 22 by a metalized layer 35. The effect of the high voltage applied to the field plate 24 is to force the lines of equal electrical potential downward, spreading them apart and resulting in a reduced field strength as shown by lines of equal potential 29. This produces a large reduction in the electrical field strength at any one point, makes the high voltage of the unit less likely, and allows for an increased high voltage handling capability.

A layer of thermal oxide 27, 36 is provided to separate the substrate 21 from the gate 23 and the field plate 24. The gate 23 typically receives a voltage of from 0 to 12 volts and must accurately and effectively control the conductivity of the channel sections L1 and L2. It is therefore required that the thermal oxide 36 thickness between the gate 23 and the channel portions L1 and L2 of the substrate 21 should be as thin as is practical to allow for the effective control of the conductivity of the channel L1, L2 by the gate 23 voltage.

However, high voltages are felt at the field plate 24 which must be prevented from breaking through the thermal oxide layer 27 to the substrate 21, the lower portions of which are maintained at zero volt potential. To insulate the field plate 24 from substrate 21 a thick layer of thermal oxide 27, in this case between 1.2 and 2 micrometers or thicker, is required. Therefore, as shown, a variable thickness of thermal oxide 27, 36 is required over the substrate 21.

To complete the device, insulating layers 41, 42 are added to cover the junctions between dissimilar materials. These may be a silicon dioxide deposition layer, commonly known in the industry as PVX, VAPOX or CVD oxide. It can also be some other insulating dielectric (e.g. silicon nitride) deposited through R.F. sputtering or a CVD process. Finally, metal layers 35, 37 are added to make electrical contact between the FET elements and the surrounding circuits and pads on the substrate 21.

The approximate thickness of the insulating layer 41 in this embodiment is equal to or greater than 1.5 micrometers, the drain 22 depth is about 5 to 10 micrometers or deeper, the thin oxide layer 36 is about 2,000 angstroms, the source 20 depth is about 1 micrometer, the thick thermal oxide 27 is 1.2 to 2 micrometers or more, and the substrate 21 resistivity is 50 ohm centimeters or larger. Of course, these dimensions are included only to describe the chip presently being produced, and are not intended to limit the attached claims in any way.

FIG. 1B is a top view of the high voltage field effect transistor and shows the circular arrangement of the drain 22, field plate 24, gate 23 and source 20. Also shown are two possible positions (one on the drain region, the other on the field plate) for a bonding pad 31 to be used for attaching a high voltage lead to the drain 22. The gate 23 and source 20 voltages are also shown as being connected, using a typical metallic connection, to contact windows 32.

Figure 2A:
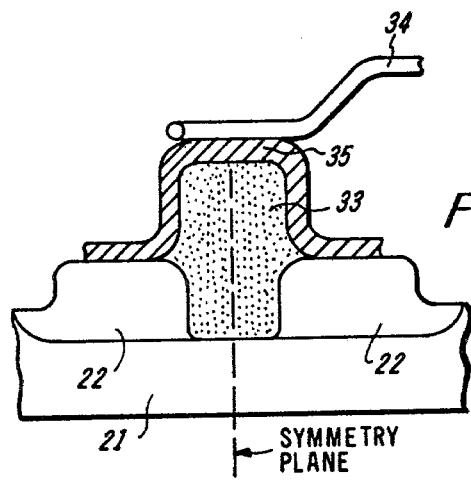
FIG. 2A is an alternate embodiment which provides a raised drain bonding pad.

Another means for connecting the high voltage line to the drain 22 is shown in FIG. 2A This figure is a cross-sectional view, similar to the drain 22 portion of FIG. 1A, with the exception that an additional thick oxide layer 33 is grown at the center of the drain 22. As in FIG. 1A a metal layer 35 is then deposited which connects the field plate, not shown, to the drain 22. In the configuration shown in FIG. 2A this metal layer 35 will also cover the thick oxide portion 33. The high voltage lead 34 may now be attached to the raised portion of the metal layer 35 using any standard bonding technique. The advantage of this configuration is that the mechanical stresses applied during the bonding operation are taken out by the electrically inert thermal oxide layer 33 and are therefore less likely to generate faults in the drain/channel junction. Faults of this type detract from the device reliability by making a junction voltage breakdown failure more likely.

Figure 2B:
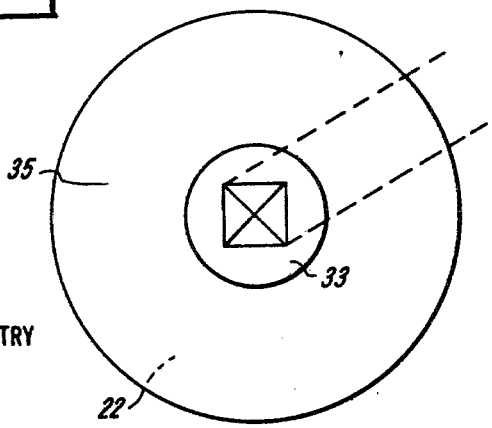
FIG. 2B is a top view of the FIG. 2A device.

FIG. 2B is a top view of the drain portion of the FET as shown in FIG. 2A. The pad area 31 is that portion of the metal layer 35 which covers the thick oxide portion 33 at the center of the FET drain, the pad area 31 also making contact with the drain 22 through the continuation of this metal layer 35.

Figure 2C:
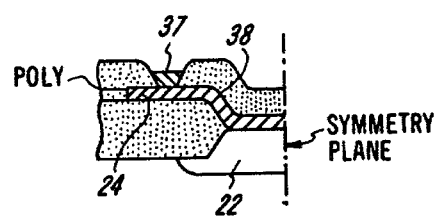
FIG. 2C is an alternate embodiment showing a buried connection between the plate and drain.

In another embodiment, as shown in FIG. 2C, the field plate 24 and drain 22 are connected by a buried conductor 38 of conducting doped polysilicon or any other conducting material. The advantage of this configuration is that there is considerably less liklihood of failure to make a good electrical contact between the field plate 24 and drain 22. In comparison, the metal layer 35 in FIG. 1A must bend around a rather steep layer of PVX insulation 41. Under this condition there is a possibility of failing to make a good electrical contact between the field plate 24 and the drain 22. This problem is more severe in the higher voltage applications since the insulating layer 41 is thicker, resulting in a higher step and a potential metal line breakage.

Figure 2D:
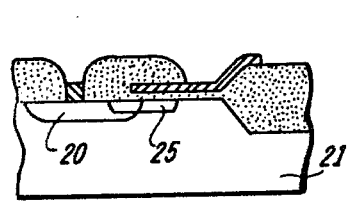
FIG. 2D is an alternate embodiment comprising a diffused source and an implanted channel P region.

Another embodiment is shown in FIG. 2D. Here, the P region 25 is implanted into the substrate 21 before the source 20 n+ region is diffused into the substrate 21. Using this implantation process, a more accurately defined short channel length and device threshold (turn on) voltage can be produced. The corresponding disadvantage is that a separate masking step is involved which normally results in some reduction in yield.

Figure 2E:
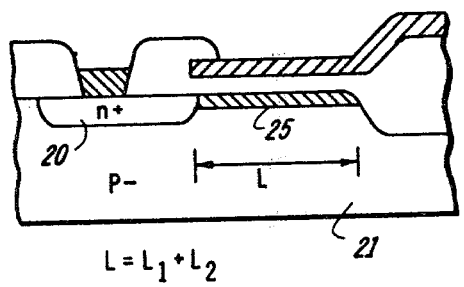
FIG. 2E is an alternate embodiment comprising a channel P region extending from the source to the thick oxide layer.

Another embodiment is shown in FIG. 2E. Here, the P region 25 is implanted into the substrate 21 before the source 20 n+ region is diffused into the substrate 21. Using this implantation process, a more accurately defined device threshold voltage can be produced. In addition, the implantation step can be a blanket implantation without using the additional masking step required in FIG. 2D.

Figure 3:
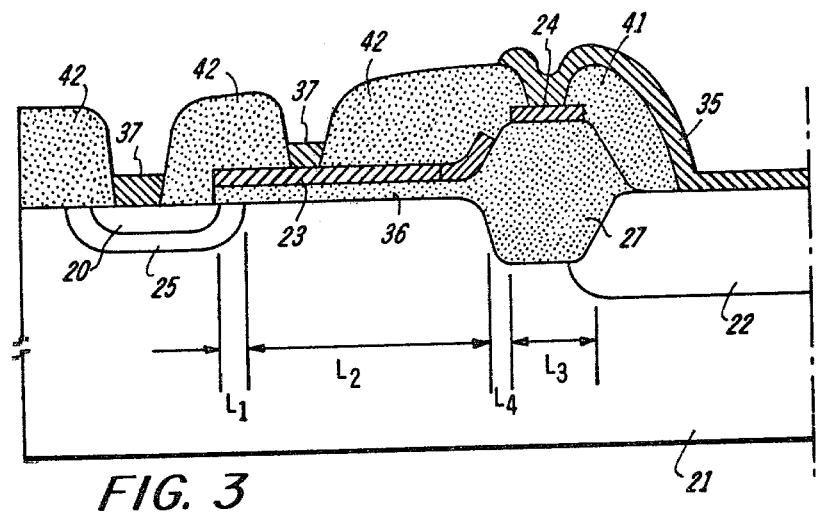
FIG. 3 is an alternate embodiment with a shortened drift region.

The device of FIG. 3 is a modification of the device of FIG. 1A to allow for higher current conducting capability, lower output voltage during device conduction and greater switching speed. The thick thermal oxide layer 27 in the FIG. 3 version is shortened considerably, while the gate 23 is correspondingly lengthened. The result is a much smaller drift area L5 in the FIG. 3 version and a much larger channel area L2 under control of the gate 23. A larger amount of the radial distance between the source 20 and drain 22 is under the control of the gate 23, allowing the enhancement effect of the gate 23 to provide a longer low-resistance channel in the FIG. 3 version than in the FIG. 1A version, thereby allowing a greater current conducting ability. In addition, in consideration of the capacitive load always seen by devices of this type, the increased current conducting capability also increases the circuit speed.

In comparison, the embodiment shown in FIG. 1A has a very long drift region comprising regions L3 and L4. When a positive voltage is applied to the gate 23, the device conducts, lowering the voltage on the field plate 24 and drain 22. Under this condition a very large series resistance develops and the output voltage cannot be reduced to a very low value. In the embodiment of FIG. 3 the amount of channel area under control of the gate 23 is much larger and the drift region L5 is much smaller, resulting in a much lower series resistance and output voltage during device conduction.

The corresponding disadvantage of the embodiment of FIG. 3 is the smaller area L5 under the field plate 24 in which there will be a more concentrated electrical field gradient, resulting in a higher probability of voltage breakdown. The result is that the FIG. 3 embodiment has a higher current conducting capability but a lower voltage handling capability. The actual device is limited to a maximum drain 22 voltage of somewhat more than 400 volts.

As in the previous embodiment, and also in all subsequent embodiments to be discussed, the modifications shown in FIGS. 2A, 2C, 2D and 2E can be made to this embodiment.

Figure 4:
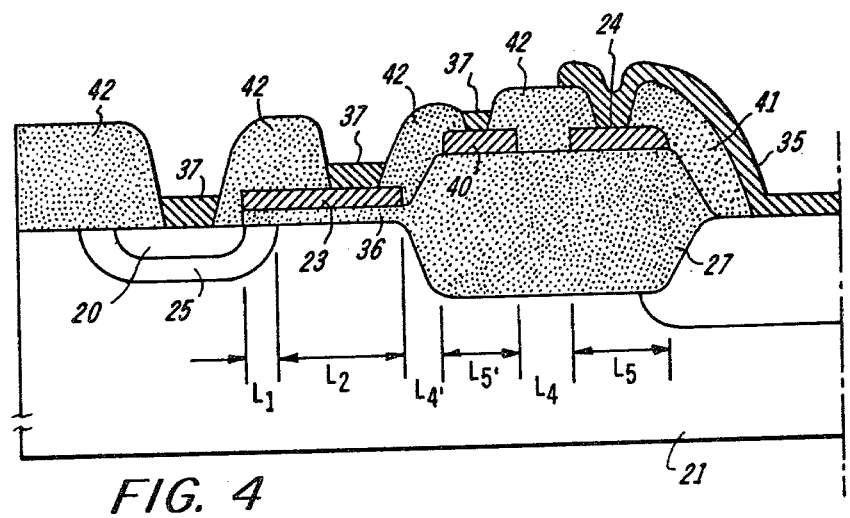
FIG. 4 is an alternate embodiment comprising an intermediate gate.

Another embodiment of this basic device is shown in FIG. 4. Here, an intermediate gate 40 is provided between the field plate 24 and the gate 23. This intermediate gate 40 is connected to an intermediate voltage of about 200 volts for a drain voltage of 400 v, for example. The resultant structure provides performance that is somewhat intermediate between the high current and high speed capabilities of the FIG. 3 embodiment and the high voltage capability of the FIG. 1A embodiment.

The provision of the intermediate gate improves the high voltage handling capability of the device in that the electrical field gradient lines do not bend as sharply nor are they as concentrated near the drain-channel junction as they would be without the provision of said intermediate gate 40. On the other hand, the provision of intermediate gate 40 reduces the series resistance during device conduction by providing an additional high voltage point which tends to decrease the resistance of a portion L5 of the total channel length. The corresponding disadvantage of this configuration is that a separate and additional voltage must be provided to the device.

The provision of an additional power supply is usually a significant addition to the circuit cost in that the separate voltage must be produced by a power supply and must also be routed through the chip to all the points where it is needed. In this case however, a simple voltage divider from the 400 volt power supply used for the drain voltage, for example, is all that is needed to produce this voltage, so that the provision of the extra voltage is not a significant problem. However, the necessity of delivering this separate voltage to each amplifier is a potential complication in the device architecture.

Figure 5:
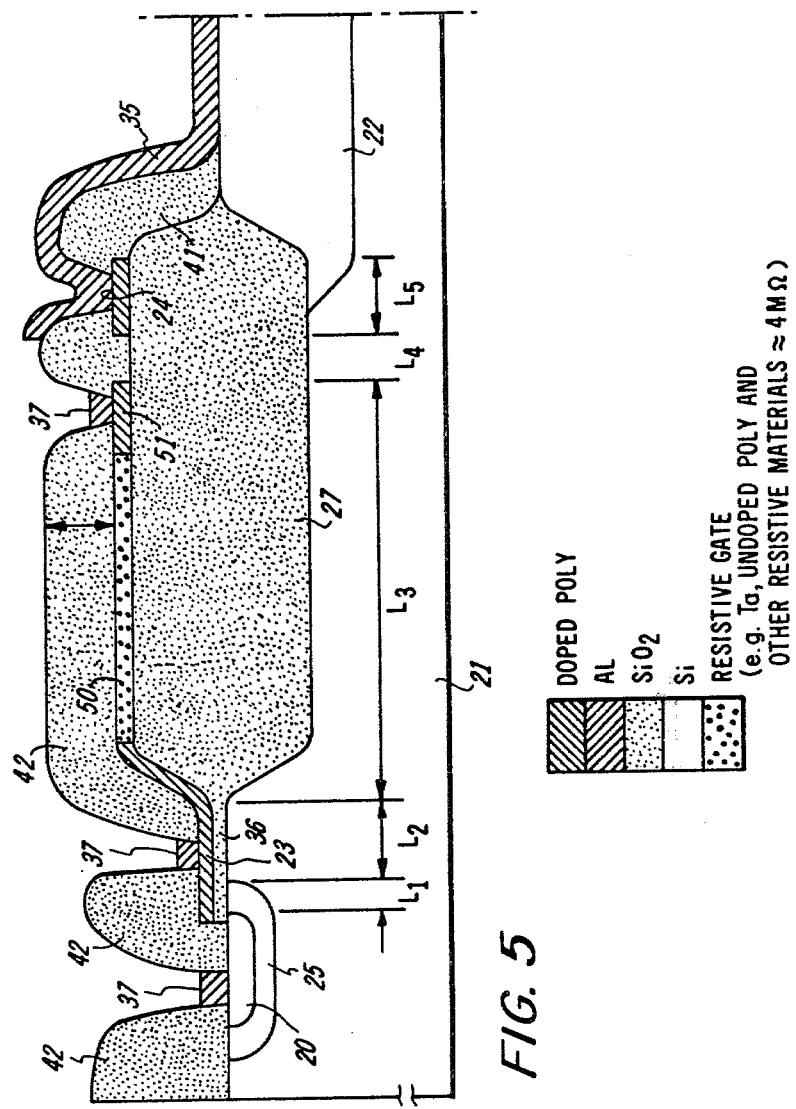
FIG. 5 is an alternate embodiment comprising a resistive gate.

The embodiment of FIG. 5 includes a resistive layer 50 connecting the gate 23 and an intermediate contact identified in this diagram as the resistive gate contact 51. This embodiment is also a compromise between the high voltage handling capability of the FIG. 1A embodiment and the high current capability of the FIG. 3 embodiment. In this case a high voltage handling capability is insured since the substrate 21 sees a voltage at the other side of the thick thermal oxide layer 27 which rises smoothly from approximately zero volts at the gate 23 to a high voltage at the resistive gate contact 51 and the field plate 24. This results in a relatively small voltage gradient at all points in the drift region and a high voltage handling capability. On the other hand, the high voltage at and near the resistive gate contact 51 is felt in the drift region over length L3 resulting in greater conduction enhancement and a reduced series resistance during device conduction resulting in a higher current handling capability, lower output voltage and higher speed. One advantage of this configuration over the embodiment shown in FIG. 4 is that an additional power supply is not necessary since contact 51 can use the same voltage used for the drain 22 voltage. The corresponding disadvantage of this configuration is the extra step required to produce the resistive layer. However, the dimensions of the mask required for the production of this resistive layer are very large and the tolerances are not critical so that there is relatively little effect of this extra masking step on the yield. There is a certain amount of power consumption in the resistive layer 50 as the current flows between gate 23 and the resistive gate contact 51. However, by making the resistance of this layer very high, scant power is used and the total circuit power consumption is well below the package limitations.

In all of the above embodiments the field plate 24 has been shown connected to the drain 22. In fact, this is not a necessity, the field plate 24 may be isolated from the drain 22 and supplied with an independent voltage.

In a typical installation sixteen or more of these high voltage FET devices and a controlling digital circuit will be produced on a single substrate and bonded in a package. The output pins will be connected by wire directly to the bonding pad on the drain of each individual HIFET and will output a voltage switched between a high voltage value of 200 to 900 volts and a nominal low voltage of below 10 to 20 volts. The remaining pins may be used for receiving the various logic inputs and power supply voltages.

Figure 6:
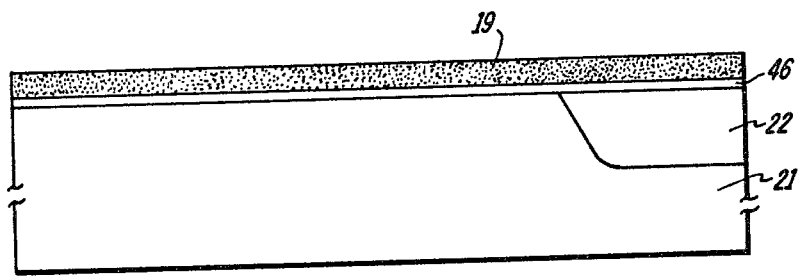
FIGS. 6 through 13, show the processes used to fabricate the FIG. 1A embodiment and the FIG. 2D alternate embodiment.

The process for manufacturing these high voltage FET devices can be described in conjunction with FIGS. 6 through 13. During the first step mask No. 1 is used to open a drain 22 diffusion window. Then a deposition or ion implantation of phosphorus or other n-type impurities or a combination of both and a deep drive-in are used to create a gradually doped n+ drain region 22 in the P-substrate 21. Finally, an initial silicon dioxide layer 46 is grown on the substrate and a silicon nitride layer 19 or other dielectric layer is deposited, resulting in the configuration as shown in FIG. 6.

Figure 7:
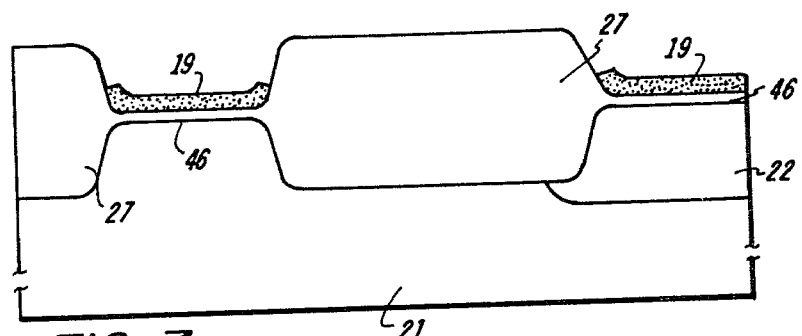

In FIG. 7, mask No. 2 is used to open windows for the growth of thick thermal oxide or field oxide layer 27. These layers are approximately 1.2 to 2, or more, micrometers in thickness in the disclosed embodiment.

Figure 8:
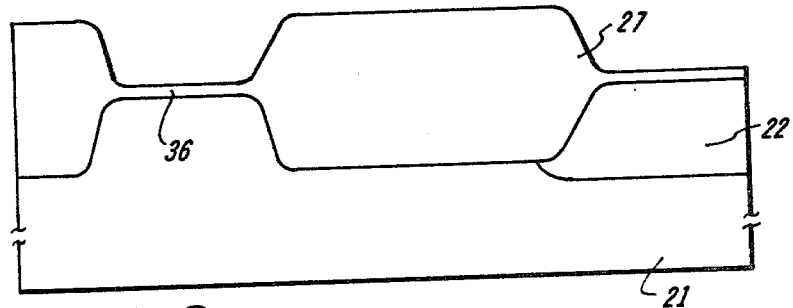

FIG. 8 shows the removal of the silicon nitride 19 and the initial silicon oxide 46 layers and the growth of the gate oxide layer 36.

Of the remaining Figures, FIGS. 9A, 10A, 11, 12 and 13 show the process for creating the embodiment shown in FIGS. 5 and 2D which comprises a resistive gate and an implanted channel P region. FIGS. 9B, 10B, 11, 12 and 13 show the process for generating the resistive gate configuration shown in FIG. 5 with a double diffused n+ source 20 and channel P region 25.

Figure 9A:
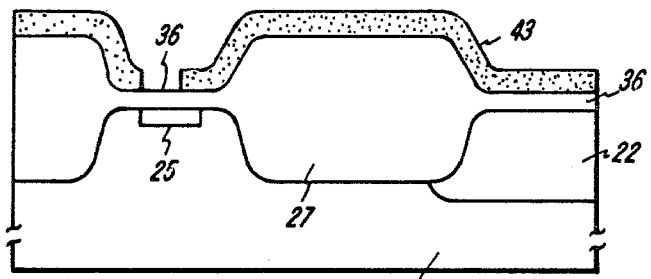

In FIG. 9A, mask No. 3 is used to create a window in the photo resist 43 through which the P region 25 is formed by implantation of boron or other P type impurities. The photo resist 43 is then removed.

Figure 10A:
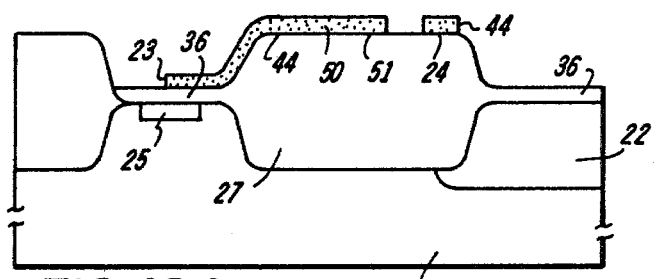

In FIG. 10A, a layer of resistive polysilicon is deposited and mask No. 4 is used to define the polysilicon 44 patterns which will ultimately become the field plate 24, gate 23, resistive gate 50 and resistive gate contact 51, as shown in FIG. 5.

The actual series of steps involved in the use of a mask in the creation of such a patterned polysilicon layer are (1) deposit a layer of polysilicon (2) apply a layer of photo resist (3) expose the photo resist (4) etch out windows in the resist (5) etch away the exposed polysilicon areas and (6) remove the remaining resist. This process, and other similar processes, are well known in the art, and are assumed in all of the process steps discussed herein.

After the FIG. 10A configuration has been produced, a polysilicon oxide layer 45 (optional) is thermally grown and/or a layer of silicon nitride 19 is deposited. Then mask No. 5 is used to define the silicon nitride layer 19 over the area of resistive polysilicon 44 on the oxide layer 27. This step selectively etches away the silicon oxide 45 and the nitride 19 layer as well as the exposed oxide 36 over the drain 22 and source 20 regions, resulting in the configuration of FIG. 11.

The device is next subjected to a polysilicon doping process comprising a pre-deposition or ion implantation of phosphorus or other n-type impurities and drive-in which raises the conductivity of the exposed areas of the polysilicon 44 to produce the conductive polysilicon parts of the device, the field plate 24, the resistive gate contact 51 and the gate 23. This step also creates the source 20. The area under the nitride 19 remains resistive. Next, the nitride 19 and oxide 45 are etched off, and all surface areas of the device are covered with an insulating layer 41. Mask No. 6 is used to open the contact windows through the insulation layer 41 to open contact windows for the gate 23, resistive gate contact 51, the field plate 24 and the drain 22, resulting in the configuration of FIG. 12.

Figure 13:
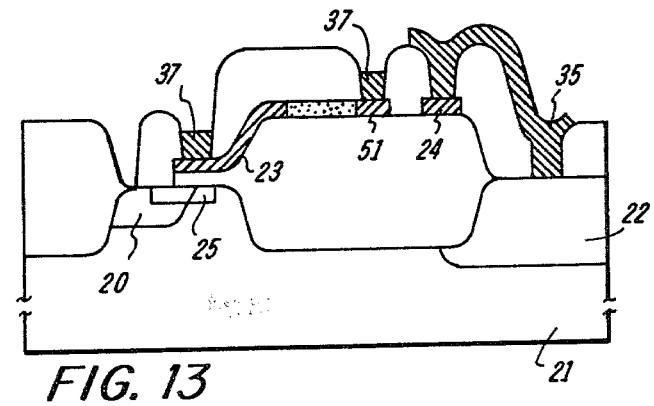

Next, Mask No. 7 is used to define the metal interconnections 35, 37 between the device elements and the other circuits on the chip. In the described embodiment, this metal layer also continuously joins the field plate 24 and drain 22 as shown in FIG. 13.

Finally, there is a deposition of a passivation layer over the entire device, and mask No. 8 is used to selectively remove portions of the passivation layer to expose metal bonding pad areas.

Figure 9B:
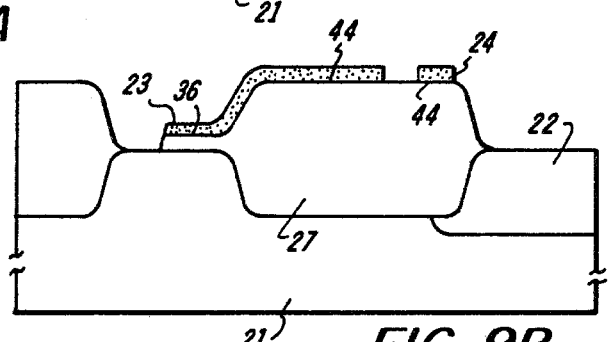
Figure 10B:
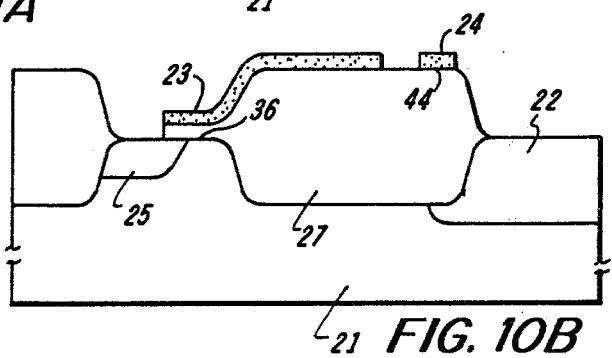
Figure 11:
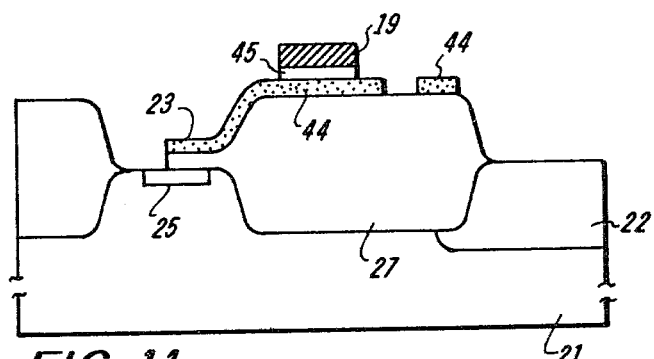
Figure 12:
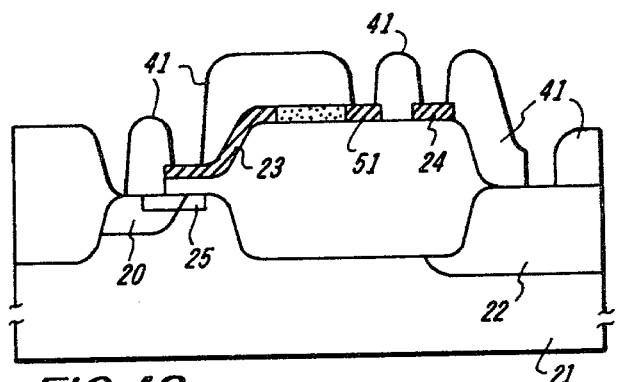

The process used to produce the embodiment shown in FIG. 5, which includes the double diffused source, is similar to the above except for the steps shown in FIGS. 9B 10B and 11. In this case, the resistive polysilicon 44 is deposited, mask No. 3 is used to define polysilicon patterns, and the exposed thin oxide 36 is etched away to yield the device as shown in FIG. 9B. Then mask No. 4 is used and the channel P region 25 is implanted with boron or other P-type impurities and driven-in to create the FIG. 10B device. The remaining steps are similar to the original process.

To produce the FIG. 1A embodiment, the above process is modified at several points from that used to produce the FIG. 5 embodiment. The steps corresponding to FIGS. 6, 7 and 8 are the same, but in FIG. 9B, only the polysilicon areas corresponding to the field plate 24 and gate 23 are formed. The channel P region 25 is then formed as in FIG. 10B, but, of course, the oxide 45 and nitride 19 layers of FIG. 11 are not formed or subsequently removed.

As before, to create the implanted channel P region 25, the implantation steps of FIG. 9A and 10A and accompanying text, are required.

The process for producing the FIG. 3 embodiment is the same as for producing the FIG. 1A embodiment except that the dimensions are changed.

Finally, the process for producing the FIG. 4 device is identical to that for the FIG. 1A embodiment except that an additional intermediate gate 40 is produced in the process shown and described in FIGS. 9B or 10A and accompanying text.

The process for fabricating the embodiment shown in FIG. 2E eliminates the use of mask No. 3 in FIG. 9A or mask No. 4 in FIG. 10B for channel P-type implantation and the total number of masks thus required is reduced to seven, the same number required for processing conventional MOSLSI circuits.

While the invention has been described with reference to several specific embodiments, those skilled in the art will recognize that the changes in form, dimensions, type of materials and placement of parts may be made to suit varying requirements within the scope of the invention.

For example, as is commonly known, through the selection of suitable impurities, n-channel as well as P-channel FET's may be fabricated using the same basic process steps described above. Similarly, depletion mode or enhancement mode FET's may be fabricated depending on whether the impurities introduced into the channel region are the same as, or opposite from, the impurities introduced into the source and drain.

What is claimed is:

1. A high voltage field effect transistor (FET), the elements of said transistor arranged on the surface of a p-type semiconductor substrate in complete concentric circles comprising, from the center and proceeding radially outward,

- an n-type drain,
- a first thick oxide layer,
- a thin oxide layer, and
- an n-type source, and further comprising a gate of conducting material covering at least a part of said thin oxide layer, a field plate of conducting material covering at least a part of said first thick oxide layer, the substrate under said thin oxide being defined as the channel region and the substrate under said thick oxide being defined as the drift region, and an intermediate gate electrically isolated from the remainder of said transistor elements, located on said first thick oxide layer between said field plate and said gate.

2. The device of claim 1 further comprising a concentric resistive layer continuously connecting said gate and said intermediate gate.

3. A high voltage field effect transistor (FET), the elements of said transistor arranged on the surface of a p-type semiconductor substrate in complete concentric circles comprising, from the center and proceeding radially outward,

- an n-type drain,
- a first thick oxide layer,
- a thin oxide layer, and
- an n-type source, and further comprising a gate of conducting material covering at least a part of said thin oxide layer, a field plate of conducting material covering at least a part of said first thick oxide layer, the substrate under said thin oxide being defined as the channel region and the substrate under said thick oxide being defined as the drift region, and wherein said channel region radial length is greater than the drift region length, allowing a higher current handling capability.

* * * * *